United States Patent
Yoshida (10) Patent No.: US 6,255,004 B1
(45) Date of Patent: Jul. 3, 2001

(54) III-V NITRIDE SEMICONDUCTOR DEVICES AND PROCESS FOR THE PRODUCTION THEREOF

(75) Inventor: Seikoh Yoshida, Toride (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/101,662

(22) PCT Filed: Nov. 27, 1997

(86) PCT No.: PCT/JP97/04338

§ 371 Date: Jul. 14, 1998

§ 102(e) Date: Jul. 14, 1998

(87) PCT Pub. No.: WO98/24129

PCT Pub. Date: Jun. 4, 1998

(30) Foreign Application Priority Data

Nov. 27, 1996 (JP) ..................................... 8-316518
Feb. 27, 1997 (JP) ..................................... 9-43717

(51) Int. Cl.[7] .......................... H01L 21/205; H01L 33/00
(52) U.S. Cl. .......................... 428/627; 428/632; 428/641; 428/698; 148/DIG. 113; 117/88; 117/952
(58) Field of Search ..................... 428/698, 620, 428/627, 632, 641; 148/DIG. 113; 117/952, 88

(56) References Cited

U.S. PATENT DOCUMENTS 4,671,928 * 6/1987 Herron et al. .......................... 419/10

FOREIGN PATENT DOCUMENTS

| 2-139929 | 5/1990 | (JP) . |
| 4-297023 | 10/1992 | (JP) . |
| 5-110138 | 4/1993 | (JP) . |
| 6-140392 | 5/1994 | (JP) . |
| 6-216409 | 8/1994 | (JP) . |
| 7-142404 | 6/1995 | (JP) . |
| 7-312350 | 11/1995 | (JP) . |
| 8-45837 | 2/1996 | (JP) . |

* cited by examiner

Primary Examiner—Francis J. Lorin
(74) Attorney, Agent, or Firm—Frishauf, Holtz, Goodman, Langer & Chick, P.C.

(57) ABSTRACT

A device made of a III-V nitride compound semiconductor comprising a substrate of sapphire, a Si single crystal, a GaAs single crystal, or a GaP single crystal; a GaN single crystal film with a thickness not greater than 3 nm formed on the substrate; and at least one layer of a III-V nitride compound semiconductor formed on the GaN single crystal film. Also a device made of a III-V nitride compound semiconductor comprising a Si single crystal substrate having a natural oxide film; a SiOn film formed by partially nitriding the natural oxide film; and a layer of a III-V nitride compound semiconductor formed on the SiON film.

11 Claims, 2 Drawing Sheets

III-V NITRIDE SEMICONDUCTOR DEVICES AND PROCESS FOR THE PRODUCTION THEREOF

TECHNICAL FIELD

The present invention relates to a device made of a III-V compound semiconductor nitride and a manufacturing method therefor and, more particularly, to a device made of a III-V compound semiconductor nitride, in which a high-quality III-V compound semiconductor nitride layer, especially a GaN compound semiconductor layer, is formed on a substrate regardless of the type of the substrate used, and a manufacturing method therefor.

BACKGROUND ART

Various types of transistors and optical devices are manufactured by using semiconductor materials. These semiconductor devices are generally manufactured as follows: A predetermined semiconductor material is made to epitaxially grow on a substrate made of a predetermined material to form a laminated structure consisting of one or more semiconductor layers, and then, after treatment such as etching, doping, patterning, and the like is performed on the semiconductor laminated structure, electrodes are mounted at predetermined locations.

As a semiconductor material for manufacturing such a semiconductor device, a III-V compound semiconductor represented by GaAs has so far been used widely.

Among III-V compound semiconductors, a III-V compound semiconductor nitride such as BN, AlN, InN, and GaN, especially a GaN compound semiconductor such as GaN, AlGaN, InGaN, and AlInGaN, is anticipated as a material for an optical semiconductor device because it operates in a wide band from visible light to ultraviolet light and also can operate at high temperatures. In particular, among the GaN compound semiconductors, GaN attracts attention as a material for a blue light emitting diode.

When a semiconductor device is manufactured by using the GaN compound semiconductor, a GaN single crystal substrate is needed.

However, in preparing GaN single crystals, the horizontal Bridgman method, the pull method, etc., which have usually been used as a crystal growth technique for a III-V compound semiconductor such as GaAs, cannot be used because GaN, whose crystal structure is of a wurtzite type, has a melting point exceeding 2000° C. and moreover has a high vapor pressure at the melting point. Therefore, bulk crystals of GaN are difficult to manufacture, so that a GaN single crystal wafer cannot be manufactured.

For this reason, in preparing GaN single crystals, the epitaxial growth method must be used.

In this case, since a GaN single crystal wafer cannot be used as a substrate for crystal growth, a material of a different type such as sapphire must be used as a substrate for crystal growth.

However, since the difference in lattice constant between sapphire and a GaN compound semiconductor is 20% or more, even if a GaN compound semiconductor is made to epitaxially grow directly on a substrate made of sapphire, many lattice defects exist in the obtained crystal, so that the quality required for actual use cannot be achieved.

To solve this problem, conventionally, a buffer layer consisting of amorphous AlN is once formed on a sapphire substrate, for example, by the metal-organic chemical vapor deposition method (MOCVD method), and then a single layer or plural layers of GaN, AlGaN, InGaN, etc. are stacked on the buffer layer. Alternatively, after a buffer layer consisting mainly of amorphous GaN is formed beforehand on a sapphire substrate by the MOCVD method in the same way, GaN is made to epitaxially grow to a great thickness on the buffer layer.

In either case, a buffer layer consisting of amorphous AlN or GaN is formed on the surface of, for example, a sapphire substrate, which is a material of a different type, and then the intended GaN compound semiconductor is made to epitaxially grow.

This amorphous buffer layer can be formed at a temperature lower than the temperature at which epitaxial crystals for a component of a buffer layer are made to grow. For example, an amorphous GaN buffer layer can be formed by the MOCVD method at a temperature of 500 to 600° C., or it can be formed by the gas source molecular beam epitaxial method (GSMBE method) at a temperature of 500 to 550° C.

However, the conventional formation of an amorphous buffer layer presents problems described below.

First, there is a problem in that the surface condition of an amorphous buffer layer is difficult to control.

This buffer layer is formed so that an amorphous substance such as AlN and GaN having grown in an island form on the sapphire substrate grows planarly to cover the surface of a sapphire substrate. Therefore, to enhance the smoothness of the formed buffer layer, the film thickness of the buffer layer must be increased up to a thickness not less than a certain value. The increased film thickness of the buffer layer is necessary not only from the viewpoint of the security of the aforesaid surface smoothness, but also from the viewpoint of the decrease in the difference of the lattice constant between the sapphire substrate and the epitaxially growing crystal of the GaN compound semiconductor formed on the buffer layer and the enhancement of crystallizability of the epitaxially growing crystals. For this reason, when the buffer layer is made of amorphous AlN, the film thickness thereof is about 10 to 50 nm.

However, as the film thickness of buffer layer increases, the crystallization state of the buffer layer changes from an amorphous state to a polycrystalline structure, and the surface condition is made rough. Therefore, the crystallizability of the GaN compound semiconductor formed on the buffer layer is deteriorated. Whether the surface condition of the buffer layer has been deteriorated or cannot be known even by using a refractive high energy electron diffraction (RHEED) apparatus in the process of film formation of the buffer layer because the buffer layer is not made up of single crystals.

Thus, for the amorphous buffer layer, it is difficult to control the surface smoothness thereof. Therefore, the crystallizability of the epitaxially growing crystals of the GaN compound semiconductor formed on the buffer layer is sometimes deteriorated. Consequently, the manufactured semiconductor device has a poor property and low reliability.

Also, the increased film thickness of the buffer layer prolongs the time taken for forming the buffer layer. Therefore, the productivity in manufacturing the intended semiconductor device is decreased, and also an expensive sapphire substrate is used, so that the semiconductor device becomes very expensive.

Thereupon, although an LED blue light emitting device can be obtained by using a GaN compound semiconductor, the quality and cost thereof are not necessarily satisfactory.

The development of a higher quality and more inexpensive GaN compound semiconductor device is demanded.

SUMMARY OF THE INVENTION

An object of the present invention is to provide a semiconductor device in which a III-V compound semiconductor nitride layer formed on a substrate has a high quality, regardless of the type of the substrate used, and a manufacturing method therefor, and especially a semiconductor device in which a III-V compound semiconductor nitride is a GaN compound semiconductor and a manufacturing method therefor.

Another object of the present invention is to provide a semiconductor device in which a buffer layer interposed between a substrate and a III-V compound semiconductor nitride layer is far thinner than a conventional amorphous buffer layer, and nevertheless the surface condition thereof is smooth, so that a high quality III-V compound semiconductor nitride can be made to epitaxially grow on the buffer layer, by which the manufacture cost can be decreased significantly as a whole, and a manufacturing method therefor.

To achieve the above objects, the present invention provides a device made of a III-V compound semiconductor nitride comprising: a substrate; a GaN single crystal film with a thickness not greater than 3 nm formed on the substrate; and at least one layer of a III-V compound semiconductor nitride formed on the GaN single crystal film. Hereinafter, this device is called as a first semiconductor device.

Also, the present invention provides a device made of a III-V compound semiconductor nitride comprising: a Si single crystal substrate; a SiON film formed on the surface of the Si single crystal substrate; and at least one layer of a III-V compound semiconductor nitride formed on the SiON film. Hereinafter, this device is called a second semiconductor device.

The present invention provides a manufacturing method for a device made of a III-V compound semiconductor nitride comprising the steps of: forming a GaN single crystal film with a thickness not greater than 3 nm by making GaN single crystals epitaxially grow on the surface of a substrate; and forming at least one layer of a III-V compound semiconductor nitride by making a III-V compound semiconductor nitride epitaxially grow on the GaN single crystal film. Hereinafter, this method is called a first manufacturing method.

Also, the present invention provides a manufacturing method for a device made of a III-V compound semiconductor nitride comprising the steps of: partially nitriding a natural oxide film formed on the surface of a Si single crystal substrate to form a SiON film; and forming at least one layer of a III-V compound semiconductor nitride by making a III-V compound semiconductor nitride epitaxially grow on the SiON film. Hereinafter, this method is called as a second manufacturing method.

DETAILED DESCRIPTION OF THE INVENTION

The present invention will be described in detail below for the case where the III-V compound semiconductor nitride is a GaN compound semiconductor.

Figure 1:
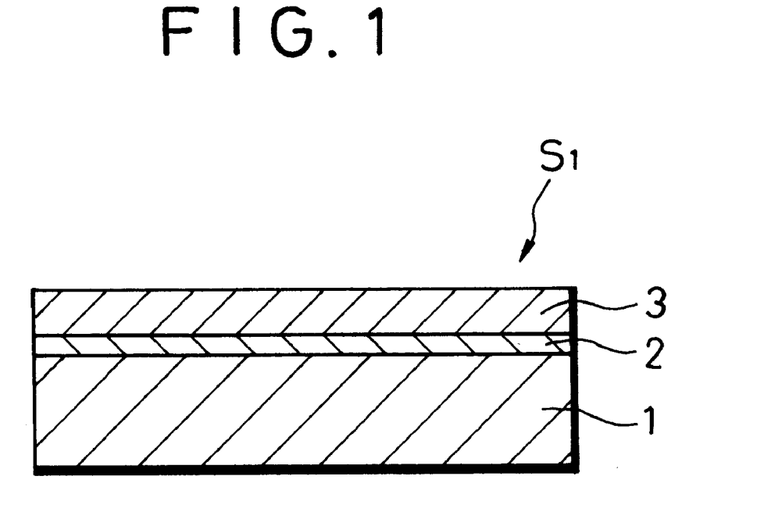
FIG. 1 is a sectional view of a first semiconductor device $S_1$ in accordance with the present invention.

FIG. 1 is a sectional view showing a basic construction of the first semiconductor device S1.

The first semiconductor device S1 is constructed so that a GaN single crystal film 2 is formed on a substrate 1, and a GaN compound semiconductor layer 3 is formed on the GaN single crystal film 2. Although the GaN compound semiconductor layer 3 is one layer in FIG. 1, a desired number of GaN compound semiconductor layers may be stacked on this layer.

In this semiconductor device S1, the material of the substrate 1 is not subject to any special restriction if it can make GaN single crystals grow on the surface, and needless to say, a sapphire substrate, which has so far been used, can be used, and also a S1 single crystal substrate, a GaAs single crystal substrate, or a GaP single crystal substrate can be used by applying the later-described method.

The GaN single crystal film 2 functions as a buffer layer when the GaN compound semiconductor is made to epitaxially grow on the substrate 1, and the film thickness thereof is set at 3 nm or less. If the film thickness is greater than 3 nm, many defects are generated on the formed GaN single crystal film, so that the crystallizability thereof is deteriorated. As a result, the crystallizability of the GaN compound semiconductor formed on the GaN single crystal film is deteriorated. Therefore, the film thickness of the GaN single crystal film 2 should preferably be 2 to 3 nm.

The GaN single crystal in the present invention means a crystallization condition in which the crystals are arranged in one direction to a degree such that a streak-shaped diffraction pattern can be observed when the obtained film is observed by RHEED, for example, a crystallization condition in which the specular beam spot intensity of film under the condition of an acceleration voltage of 25 keV is five times or more as high as that of the crystal of the material constituting the substrate, and includes the case where the crystal branches into a domain shape if the crystals are arranged in one direction.

Next, the first manufacturing method will be described.

First, the aforesaid GaN single crystal film is formed on the substrate. This GaN single crystal film can be formed by the MOCVD method or the GSMBE method. For example, with the MOCVD method, the film can be formed by supplying a Ga source such as trimethylgallium or triethylgallium and an N source such as dimethylhydrazine to the substrate while the surface temperature of substrate is controlled to be 800 to 900° C. With the GSMBE method, the film can be formed by supplying metallic Ga from a Knudsen cell and the aforesaid N source to the substrate while the surface temperature of substrate is controlled to be 650 to 750° C.

If dimethylhydrazine, ethylazide, plasma nitrogen, radical nitrogen, cracked ammonia, etc., which have a high decomposing efficiency, are used as an N source, the film forming time can preferably be shortened. If dimethylhydrazine or ethylazide is used, the crystallizability of the GaN single crystal film is improved, and therefore the crystallizability of GaN compound semiconductor formed on this film is also preferably improved.

The GaN single crystal film 2 can also be formed as described below.

First, one or two layers of metallic Ga monolayer film are formed on the surface of the substrate by supplying metallic Ga from a Knudsen cell onto the surface of the substrate to make the whole surface of the substrate Ga-rich. Then, a GaN compound semiconductor is made to epitaxially grow on this Ga-rich substrate surface.

At this time, at the early stage of growth, the supplied N source and the metallic Ga monolayer film are coupled and converted into a GaN single crystal, so that a GaN single crystal film is formed uniformly on the whole surface of the substrate. Therefore, the GaN compound semiconductor layer growing on the GaN single crystal film also becomes uniform, and the aforesaid island-form crystal growth does not occur. For this reason, it is preferable to form a metallic Ga monolayer film in advance on the surface of the substrate, because a high-quality GaN compound semiconductor layer can be formed on the surface of the substrate despite the fact that the film thickness is very thin.

By making a desired GaN compound semiconductor epitaxially grow on the GaN single crystal film, the first semiconductor device S1 can be obtained.

When a GaAs single crystal substrate or GaP single crystal substrate is used as a substrate, a GaN single crystal film can be formed on this substrate as described below.

The substrate is heated to about 600 to 650° C. under a super-high vacuum while supplying As in the case of a GaAs single crystal substrate or P in the case of a GaP single crystal substrate to the surface of the substrate. Such treatment makes the uppermost surface of the substrate crystal Ga-rich.

Therefore, if a desired GaN compound semiconductor is made to epitaxially grow on this Ga-rich substrate surface, Ga on the substrate surface reacts with an N source to form a GaN single crystal film thereon.

Next, the second semiconductor device will be described.

Figure 2:
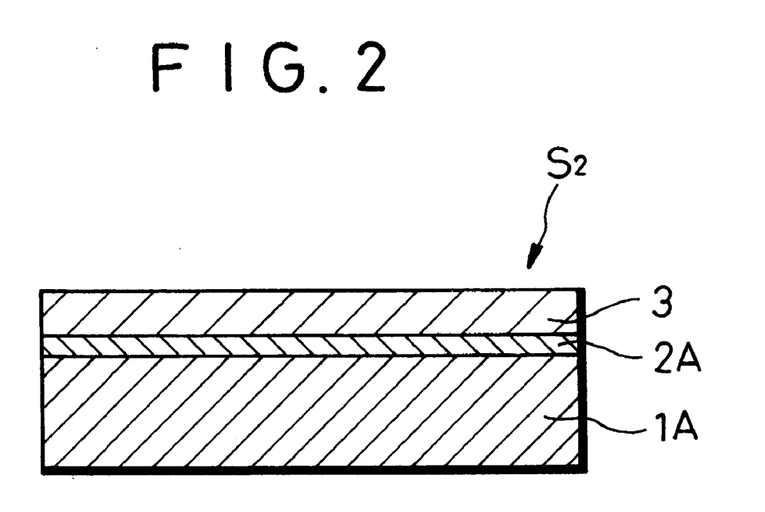
FIG. 2 is a sectional view of a second semiconductor device $S_2$ in accordance with the present invention.

FIG. 2 is a sectional view showing a basic construction of the second semiconductor device S2. The second semiconductor device S2 is constructed so that a SiON film 2A is formed on a S1 single crystal substrate 1A, and a GaN compound semiconductor layer 3 is formed on the SiON film 2A.

Although the GaN compound semiconductor layer 3 is one layer in FIG. 2, a desired number of GaN compound semiconductor layers may be stacked on this layer as in the case of the first semiconductor device S1.

In this second semiconductor device S2, the SiON film 2A functions as a buffer layer, and the film thickness thereof should be not more than 2 nm.

In the case of the second semiconductor device 2S, it is preferable to form a Ga single crystal film, which has been explained with regard to the first semiconductor device S1, on the SiON film 2A and to further form the GaN compound semiconductor layer 3 on this Ga single crystal film, because the crystallinity of the GaN compound semiconductor layer 3 can further be improved.

Next, the second manufacturing method will be described.

Generally, a S1 single crystal substrate obtained by slicing a bulk crystal is formed with a natural oxide film ($SiO_2$ film) with a thickness of about 5 nm. When various electron devices are manufactured by using this substrate, all of the natural oxide film is usually removed by etching using various etchants to expose a substrate crystal, and then necessary film forming treatment of various kinds is carried out.

However, in the case of the second semiconductor device S2, the S1 single crystal substrate having the natural oxide film may be used as it is, or the S1 single crystal substrate with the natural oxide film with a thickness not more than 2 nm, preferably about 0.5 to 1 nm, being left may be used as a substrate for crystal growth without completely removing the natural oxide film by etching.

This is based on the knowledge that if the natural oxide film is nitrided, it is converted into a SiON film, which sufficiently functions as a buffer layer in the aforementioned epitaxial growth method.

First, a S1 single crystal substrate formed with a natural oxide film on the surface thereof is set on a later-described crystal grow apparatus. An N source is supplied to the surface of the substrate to partially nitride the natural oxide film ($SiO_2$) and to convert it into a SiON film. Usually, the surface temperature of the substrate is set at 550 to 750° C., and the treatment time may be 2 to 10 minutes, for example, when the thickness of the natural oxide film is not more than 2 nm, depending on the thickness of the natural oxide film. The supply amount of the N source is not subject to any special restriction, but it must be not less than the theoretical amount necessary to convert $SiO_2$ into SiON.

Subsequently, a desired GaN compound semiconductor is made to epitaxially grow on the SiON film 2. For example, when the GaN compound semiconductor is GaN, after the SiON film 2 is formed, the temperature is usually increased to about 850° C. at a rate of 20 to 70° C./min, and the GaN film is formed while the temperature fluctuation is kept within ±0.5° C.

An example of a crystal growth apparatus used when the device of the present invention is manufactured will be described with reference to FIG. 3.

Figure 3:
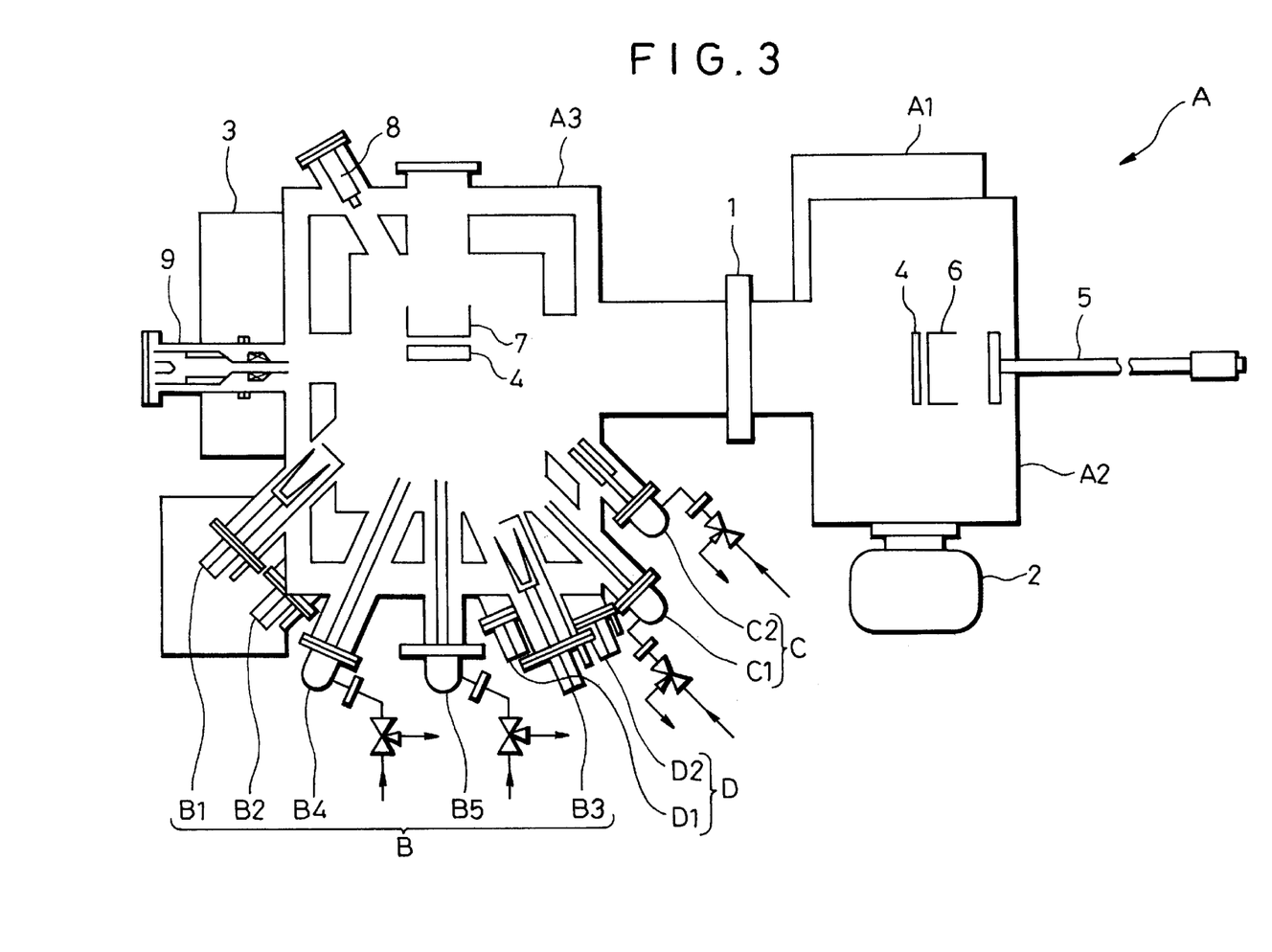
FIG. 3 is a schematic view of a crystal growth apparatus used to carry out the present invention.

The apparatus A shown in FIG. 3 has an introduction chamber A1, preparation chamber A2, and growth chamber A3. A gate valve (not shown) is provided between the introduction chamber A1 and the preparation chamber A2, and a gate valve 1 is provided between the preparation chamber A2 and the growth chamber A3.

The introduction chamber A1 is provided with a turbo-molecular pump (displacement: 500 liters/sec) combined with a rotary pump, so that the introduction chamber A1 can be evacuated from the atmospheric pressure to $1\times10^{-10}$ Torr.

The preparation chamber A2 is provided with an ion pump 2 with a displacement of, for example, 500 liters/sec, and the growth chamber A3 is provided with a diffusion pump 3 with a displacement of, for example, 500 liters/sec, so that the preparation chamber A2 can be evacuated to a super-high vacuum of $1\times10^{31\ 11}$ Torr, and the growth chamber A3 can be evacuated to a predetermined super-high vacuum.

A rotatable substrate holder (not shown) is disposed at the central portion of the preparation chamber A2 to hold a substrate 4, and a transfer rod 5 for transferring the substrate 4 in the holder from the introduction chamber A1 to the preparation chamber A2 and from the preparation chamber A2 to the growth chamber A3 is disposed so that the center axis thereof agrees with that of the substrate holder. Also, the holder is fitted with a heater 6 so that the substrate 4 in the holder can be heated to a predetermined temperature.

The introduction chamber A1, preparation chamber A2, and growth chamber A3 each have a peephole (not shown) so that the transfer of the substrate 4 to each chamber can always be observed.

Next, the configuration of the growth chamber A3 will be described.

First, supply means B for the III group element source is mounted at the lower part of the growth chamber A3. Specifically, this supply means B includes supply means B1 for metallic Ga, supply means B2 for metallic In, supply means B3 for metallic A1, supply means B4 for trimethyl-gallium (TMG: $Ga(CH_3)_3$), and supply means B5 for triethylgallium (TEG: $Ga(C_2H_5)_3$).

Also, supply means C for the N source is mounted in the growth chamber A3. Specifically, the supply means C includes a supply means C1 for ammonia and supply means C2 for dimethylhydrazine (DMHy: $(CH_3)_2N(NH_2)$).

Further, supply means D1 for metallic S1 and supply means D2 for metallic Mg are mounted in the growth chamber A3, which constitutes supply means for dopant.

Of these supply means, the supply means B1, B2, B3, D1, and D2 are publicly known as Knudsen cells each. A pBN-made crucible with a content volume of, for example, 100 cc is disposed at the center in the cell, a heater made of, for example, Ta is disposed on the outside of the cell, and a heat insulating plate is wound on the outside thereof to prevent heat dissipation. Also, an automatic shutter opening/closing mechanism, which is operated by computer control, is installed at the ejection port of the cell. Of these cells, the cell for supply means B1 has an outside heater of two-stage construction to prevent the scattering of Ga drops.

These supply means B each are charged with a predetermined metallic element as a raw material. By operating the heater outside the cell, the temperature of each metallic element put in the cell is controlled precisely, and each raw material is ejected as a flux toward the surface of substrate, described later, through the ejection port of the cell. At this time, the density of flux can be regulated precisely by precisely controlling the heater temperature. Momentary switching between supply and non-supply of flux to substrate can be performed by momentarily opening/closing the cell shutter by computer control, so that a steep growth interface can be obtained.

Other supply means B4, B5, C1, and C2 each have a variable leak valve or a mass flow controller because the raw material supplied from these supply means is a fluid, so that the flow rate of raw material can be controlled precisely.

For example, for the ammonia supply means C1, ammonia is put into a cylinder of, for example, 10 liters and introduced into the growth chamber A3 through a ¼-inch stainless steel pipe while the flow rate thereof is controlled precisely by the mass flow controller. Also, for the dimethylhydrazine supply means C2, dimethylhydrazine is put into a cylinder of, for example, 50 milliliters and similarly introduced into the growth chamber A3 through a ¼-inch stainless steel pipe while the flow rate thereof is controlled precisely by the variable leak valve.

At the center of the growth chamber A3, a manipulator for setting the substrate 4 transferred from the preparation chamber A2 is disposed, and further a substrate heater 7 of, for example, 3 inches in diameter is disposed, whereby the substrate 4 set by the manipulator is heated and held at a predetermined temperature. This manipulator can minutely move the substrate 4 in the x-axis Y-axis, and Z-axis directions independently, and also is provided with a rotating mechanism.

The substrate 4 is set so that the surface thereof faces downward, being opposed to the aforesaid supply means.

The positional relationship between the surface of the substrate 4 and each cell of the supply means B1, B2, D1, and D2 is set with great care because the positional relationship has an great influence on the crystal uniformity in the crystal plane of crystal growing on the surface of the substrate 4.

Specifically, if an attempt is made to make the uniformity in the crystal plane of growing crystal within ±1%, it is referable that the ejection port of each supply means be disposed at an angle of 35° with respect to the surface of the substrate 4 and also the crucible in each Knudsen cell be disposed at an inclination angle of 3 to 7° with respect to the cell axis.

The temperatures of each of the Knudsen cells and the substrate heater 7 are controlled by using a FICS11 (precision controller made by Eurotherm Co., Ltd.). As a power supply for the cell and heater, a d.c. stabilized power supply is used to restrain power supply fluctuations to the utmost. This power supply and the aforesaid FICS11 are designed so that precise temperature control is carried out by connecting the power supply and FICS11 each to a computer, and the fluctuation in cell temperature during epitaxial growth is within ±0.5° C.

Also, in the growth chamber A3, a quadrupole mass spectrometer (QMS) 8 is provided to analyze the reaction gas in the chamber, and further a RHEED apparatus 9 is provided to observe in situ the state of crystal growth on the surface of the substrate 4.

BEST MODE OF CARRYING OUT THE INVENTION

The semiconductor devices in accordance with the present invention were manufactured as described below by using the crystal growth apparatus shown in FIG. 3.

WORKING EXAMPLE 1

(1) Manufacture of the first semiconductor device whose ubstrate is sapphire

A sapphire substrate with a diameter of 5 cm was subjected to ultrasonic cleaning with acetone for 15 minutes. After the surface of the substrate was etched with hot phosphoric acid solution of a temperature of 150° C., the substrate was cleaned with ultrapure water, and immediately set in the introduction chamber A1.

Next, the turbo-molecular pump, not shown, was operated to evacuate the introduction chamber A1, and also the ion pump was operated to evacuate the preparation chamber A2. When both of the chambers were evacuated to $5 \times 10^{-8}$ Torr, the gate valve, not shown, was opened, and the sapphire substrate was transferred from the introduction chamber A1 to the preparation chamber A2 by using the transfer rod 5 and set on the substrate holder, not shown.

When the preparation chamber A2 was further evacuated to a vacuum of $1 \times 10^{-9}$ Torr, the substrate 4 was heated to 500° C. by operating the substrate heater 6, and held at that temperature for 15 minutes. After moisture etc. were removed from the substrate surface, the substrate 4 was cooled to a temperature of 80° C.

During the aforesaid operation, in the growth chamber A3, the adjustment of the III group element supply means and the dopant supply means and the adjustment of the N source supply means are made.

For the metallic Ga supply means B1, the heater of the Knudsen cell is operated to raise the temperature to 900° C., and an adjustment is made so that the flux gage vacuum of metallic Ga flux is $6.0 \times 10^{-7}$ Torr. At this time, the heater temperature fluctuation is controlled to be within ±0.2° C., whereby the fluctuation in metallic Ga flux density is kept within ±1%.

For the metallic In supply means B2, the heater of the Knudsen cell is operated to raise the temperature to 750° C., and an adjustment is made so that the flux gage vacuum of metallic In flux is $3.0 \times 10^{-7}$ Torr. At this time, the heater temperature fluctuation is controlled to be within ±0.2° C., whereby the fluctuation in metallic In flux density is kept within ±1%.

For the metallic A1 supply means B3, the heater of the Knudsen cell is operated to raise the temperature to 1000° C., and an adjustment is made so that the flux gage vacuum of metallic A1 flux is $3.0 \times 10^{-7}$ Torr. At this time, the heater temperature fluctuation is controlled to be within ±0.2° C., whereby the fluctuation in metallic Al flux density is kept within ±1%.

For the metallic S1 supply means D1, the heater of the Knudsen cell is operated to raise the temperature to 1280° C., and adjustment is made so that the flux gage vacuum of metallic Si flux is $5.0 \times 10^{-9}$ Torr. At this time, the heater temperature fluctuation is controlled to be within ±0.2° C., whereby the fluctuation in metallic S1 flux density is kept within ±1%.

For the metallic Mg supply means D2, the heater of the Knudsen cell is operated to raise the temperature to 220° C., and an adjustment is made so that the flux gage vacuum of metallic Mg flux is $5.0 \times 10^{-9}$ Torr. At this time, the heater temperature fluctuation is controlled to be within ±0.2° C., whereby the fluctuation in metallic Mg flux density is kept within ±1%.

After such an adjustment is completed, the shutter of each Knudsen cell is kept closed so that a flux can be supplied any time.

For the ammonia supply means C1, an adjustment is made so that the flow rate of ammonia gas is 4 sccm by the mass flow controller and the flux gage vacuum is $6.0 \times 10^{-6}$ Torr. At this time, the fluctuation in flux density is kept within ±1% by controlling the mass flow controller.

For the dimethylhydrazine supply means C2, the opening of the variable leak valve is adjusted so that the flux gage vacuum of dimethylhydrazine flux is $4 \times 10^{-5}$ Torr. At this time, the fluctuation in flux density is kept within ±1% by controlling the opening of the variable leak valve.

After such an adjustment is completed, the shutter of each Knudsen cell is kept closed so that a flux can be supplied any time.

Upon completion of the aforesaid preparation work, the gate valve 1 is opened, and the substrate 4 is transferred from the preparation chamber A2 to the growth chamber A3 by using the transfer rod 5 and set to the substrate heater 7.

When the growth chamber A3 is evacuated and the vacuum reaches $1 \times 10^{-9}$ Torr, the substrate heater 7 is operated while the substrate is rotated at a rotational speed of 10 to 20 rpm to increase the surface temperature of the substrate to 700° C. The substrate 4 is kept being rotated at the aforesaid rotational speed until all operations for crystal growth is completed.

In the above-mentioned heating process, the natural oxide film existing on the surface of the sapphire substrate 4 is removed.

When the surface temperature of the substrate 4 was stabilized at 700° C., metallic Ga and dimethylhydrazine were supplied onto the surface of the substrate 4 from the supply means B1 and C2, respectively, to form a GaN film. At this time, the fluxes of metallic Ga and dimethylhydrazine were set at $6 \times 10^{-7}$ Torr and $4 \times 10^{-5}$ Torr, respectively.

The growing film in this film forming process was observed momently by RHEED.

As a result, one minute after the supply start, a spot showing a GaN crystal began to appear between spot rows showing surface crystals of the sapphire substrate. At the time when a specular spot showing surface crystal of the sapphire substrate does not disappear, that is, when an RHEED spot of the substrate does not disappear, the operation of GaN crystal growth was stopped. The time required for this operation was 5 minutes.

The RHEED pattern of the formed GaN film was a streak-shaped spot, and a specular spot of the sapphire substrate was also verified at this time.

From this RHEED pattern, it was verified that a GaN single crystal film having a smooth surface was formed on the sapphire substrate 4, and moreover the thickness of the GaN single crystal film was on the order of atom.

The film thickness was observed by an Auger measurement and a transmission electron microscope, and it was found that the film had a thickness corresponding to 2 nm.

The GaN film was formed repeatedly under the above conditions. At each formation, the RHEED pattern of the growing film was observed, and it was found that a GaN single crystal film with a thickness of 2 nm could be formed with high reproducibility.

Thus, the momentary observation by RHEED enables the control of the thickness of the growing GaN film and the effective crystal evaluation for it.

Next, the process transfers to the epitaxial growth of a GaN compound semiconductor.

First, the N source is switched from dimethylhydrazine to ammonia. The reason for this is that if a GaN compound semiconductor with a thick film is made to epitaxially grow using dimethylhydrazine, a large quantity of C is mixed in the growing crystal, so that it is difficult to obtain a pure crystal, and the use of ammonia allows a pure crystal to be obtained.

The shutters of the metallic Ga supply means B1 and the dimethylhydrazine supply means C2 were closed, the surface temperature of the substrate 4 was raised to 850° C., and the shutter of the ammonia supply means C1 was opened at that time to supply ammonia to the substrate surface (the surface of GaN single crystal film).

When the fluctuation in the surface temperature of the substrate 4 became within ±0.1° C., the shutter of the metallic Ga supply means B1 was opened to supply a metallic Ga flux ($6 \times 10^{-7}$ Torr) onto the substrate surface, by which the epitaxial growth of GaN was started. The required time from the start of ammonia supply to the start of metallic Ga flux supply was about five minutes.

In the process of crystal growth, the fluctuation in the substrate surface temperature was controlled so as to be within ±1° C. of the set temperature and the fluctuation in the flux density was kept at a value not more than ±1%.

Generally, as the film formation of semiconductor material proceeds and the film thickness increases, the temperature of the film surface changes. For example, when the film of non-doped semiconductor is formed, or when the film of n-type semiconductor doping n-type impurities is formed, the film surface temperature shifts to the high temperature side, and when the film of p-type semiconductor doping p-type impurities is formed, the film surface temperature shifts to the low temperature side.

In this embodiment as well, the above-mentioned temperature change occurs. The temperature change is observed at intervals of five minutes through the peephole of the crystal growth apparatus by using a color thermometer, and the set temperature for the growth process is controlled while the change amount of temperature is corrected so that the film surface temperature is always held at a predetermined temperature.

The RHEED pattern of the GaN film during growth was observed, and it was found that the pattern showed a streak-shaped one, the film consisted of GaN single crystals, and the surface was very smooth.

The aforesaid epitaxial growth was carried out for two hours. According to the Auger measurement, the film thickness of the formed GaN layer was 500 nm. Also, the surface of this GaN layer was observed under a Nomarski microscope, and it was found that no surface defects were not observed and the surface was a good mirror surface.

(2) Effect of film thickness of GaN single crystal film

The first semiconductor device samples were manufactured by the manufacturing method of (1) under the same conditions as those shown in (1) except that GaN single crystal films with a different film thickness were formed by changing the film formation time for GaN single crystal as shown in Table 1.

The RHEED pattern of GaN layer showing a single crystal was observed, and also the GaN layer (film thickness 500 nm) after film formation was observed under a Nomarski microscope. The results are given collectively in Table 1.

The RHEED pattern of the formed GaN layer was observed, and it was found that the diffraction spot had a more distinct streak shape than the GaN layer of working example 1, and the surface smoothness was more excellent. That is, it was verified that the GaN layer in this case consisted of higher-quality crystals and had a better surface condition.

WORKING EXAMPLE 3

The first semiconductor device was manufactured as described below by using a S1 single crystal substrate.

TABLE 1

|  | Film formation time for GaN single crystal film (min) | Film thickness of GaN single crystal film* (nm) | Condition of uppermost GaN layer | |
| --- | --- | --- | --- | --- |
|  |  |  | RHEED pattern during growth | Microscopic observation |
| Device sample 1 | 1 | 0.4 | Streak-shaped pattern of GaN crystal | No surface defect, mirror surface |
| Device sample 2 | 3 | 1.2 | Streak-shaped pattern of GaN crystal | No surface defect, mirror surface |
| Device sample 3 | 7 | 2.8 | Spot-shaped polycrystalline ring pattern of GaN crystal | No surface defect, a lot of surface roughness |
| Device sample 4 | 9 | 3.5 | Spot-shaped polycrystalline ring pattern of GaN crystal | No surface defect, a lot of surface roughness |
| Device sample 5 | 11 | 4.5 | Spot-shaped polycrystalline ring pattern of GaN crystal | No surface defect, a lot of surface roughness |

*Auger measurement

As is apparent from Table 1, if the GaN single crystal film with a film thickness not greater than 3 nm is formed on the substrate prior to the epitaxial growth of GaN compound semiconductor, the GaN compound semiconductor layer stacked on the GaN single crystal film has a mirror surface without surface defects despite the fact that the film thickness is as great as 500 nm.

(3) Film formation of other GaN compound semiconductors

When the GaN layer was formed on the 2 nm-thick GaN single crystal film formed as shown in (1), metallic S1 was supplied at the same time from the metallic S1 supply means D1 to form a 500 nm-thick S1 doped GaN layer (n-type layer). Also, metallic Mg was supplied at the same time from the metallic Mg supply means D2 to form a 500 nm-thick Mg doped GaN layer (p-type layer).

In either case, the RHEED pattern in the film forming process was a streak-shaped pattern of GaN crystal, and according to the observation using a Nomarski microscope, no surface defects existed.

When the GaN layer was formed on the 2 nm-thick GaN single crystal film formed as shown in (1), metallic In was supplied at the same time from the metallic In supply means B2 to form a 500 nm-thick InGaN layer. Also, metallic A1 was supplied at the same time from the metallic A1 supply means B3 to form a 500 nm-thick AlGaN layer.

In either case, the RHEED pattern in the film forming process was a streak-shaped pattern of GaN crystal, and according to the observation using a Nomarski microscope, no surface defects existed.

WORKING EXAMPLE 2

As in the case of working example 1, the natural oxide film of the sapphire substrate was removed, and the surface temperature of the substrate was held at 700° C. A metallic Ga flux ($6.0 \times 10^{-7}$ Torr) was supplied to the substrate for 10 seconds to form a metallic Ga monomolecular film.

Then, GaN was made to epitaxially grow on the substrate surface for five minutes under the same conditions as those in working example 1.

The S1 single crystal substrate of crystal orientation (111) was subjected to ultrasonic cleaning with acetone for 15 minutes, and then dipped in hydrofluoric acid with a concentration of 100% for five minutes. Immediately after that, the substrate was set in the introduction chamber A1.

When the introduction chamber A1 and the preparation chamber A2 were evacuated to a vacuum of $5 \times 10^{-8}$ Torr, the gate valve, not shown, was opened to transfer the substrate 4 to the preparation chamber.

When the preparation chamber A2 was further evacuated to a vacuum of $1 \times 10^{-9}$ Torr, the substrate heater 6 was operated to heat the substrate 4 to 500° C. After that temperature was held for 15 minutes to remove moisture etc. from the substrate surface, the temperature was decreased to 80° C.

Then, when the growth chamber A3 was evacuated to a vacuum of $1 \times 10^{-9}$ Torr, the gate valve 1 was opened, whereby the substrate 4 was transferred from the preparation chamber A2 to the growth chamber A3 by using the transfer rod 5 and set to the substrate heater 7 so that the surface temperature of substrate is increased to 1000° C. to remove the natural oxide film on the surface.

When the surface temperature of substrate was decreased and stabilized at 700° C., a metallic Ga flux ($6.0 \times 10^{-7}$ Torr) was first supplied to the substrate surface, and after 10 seconds, a dimethylhydrazine flux ($4 \times 10^{-5}$ Torr) was also supplied.

In this case, one- or two-layer monomolecular film of metallic Ga is first formed on the substrate surface, and the film is nitrided by dimethylhydrazine to be converted into GaN.

The growing film in this film forming process was observed by RHEED.

As a result, one minute after the start of dimethylhydrazine supply, a spot showing a GaN crystal began to appear between the spot rows showing the surface crystal of sapphire substrate. At the time when a specular spot showing the surface crystal of sapphire substrate did not disappear completely, that is, when a RHEED spot of substrate did not disappear, the operation of GaN crystal growth was stopped. The required time during this operation was four to five minutes.

The RHEED pattern of the growing GaN film was a streak-shaped spot of GaN crystal, and the specular spot of sapphire substrate was verified at that time.

From this RHEED pattern, it was verified that even when the substrate is a S1 single crystal substrate, a GaN single crystal film with a flat surface was formed on the substrate, and moreover the thickness of the GaN single crystal film was on the order of atom.

The film thickness was measured by an Auger measurement and a transmission electron microscope, and it was found that the film had a thickness corresponding to 2 nm.

The GaN film was formed repeatedly under the above conditions. At each formation, the RHEED pattern of the growing film was observed, and it was found that a GaN single crystal film with a thickness of 2 nm could be formed with high reproducibility.

Then, GaN, S1 doped GaN, Mg doped GaN, InGaN, and AlGaN each were made to epitaxially grow on the GaN single crystal film under the same conditions as those in working example 1.

In any case, no surface defects existed, a high quality crystal being obtained.

WORKING EXAMPLE 4

The first semiconductor device using a GaAs single crystal substrate was manufactured as described below.

The interior of the growth chamber A3 was made in an atmosphere of As: $1 \times 10^{-6}$ Torr, and the surface temperature of the substrate set to the substrate heater 7 was increased to 620° C. to remove the natural oxide film on the surface.

Because the substrate surface was rough after the removal of natural oxide film, the surface temperature of the substrate 4 was then decreased to 580° C., and a metallic Ga flux ($1.5 \times 10^{-7}$ Torr) and an As flux ($1.5 \times 10^{-6}$ Torr) were supplied to the substrate surface at the same time to form a smooth GaAs film with a thickness of about 50 nm.

Next, the supply of the metallic Ga flux was stopped, the surface temperature of the substrate 4 was increased to 610° C., and the surface of the substrate 4 was observed by RHEED. As a result, it was verified that the RHEED pattern showed a Ga stabilized surface structure (a structure in which the uppermost surface of crystal is uniformly covered with Ga—a state of (1×1)), and the substrate surface was Ga-rich.

Then, the supply of As was shut off, and dimethylhydrazine ($4 \times 10^{-5}$ Torr) was supplied to the substrate surface for 15 minutes to make GaN epitaxially grow. After that, the RHEED pattern was observed. The RHEED pattern was the same as that of working examples 2 and 3.

WORKING EXAMPLE 5

The first semiconductor device using a GaP single crystal substrate was manufactured as described below.

The interior of the growth chamber A3 was made in an atmosphere of P: $1 \times 10^{-6}$ Torr, and the surface temperature of the substrate set to the substrate heater 7 was increased to 650° C. to remove the natural oxide film on the surface.

Because the substrate surface was rough after the removal of natural oxide film, the surface temperature of the substrate 4 was then decreased to 600° C., and a metallic Ga flux ($1.5 \times 10^{-7}$ Torr) and an P flux ($1 \times 10^{-6}$ Torr) were supplied to the substrate surface at the same time to form a smooth GaP film with a thickness of about 50 nm.

Next, the supply of the metallic Ga flux was stopped, the surface temperature of the substrate 4 was increased to 620° C., and the surface of the substrate 4 was observed by RHEED. As a result, it was verified that the RHEED pattern showed a Ga stabilized surface structure (a structure in which the uppermost surface of crystal is uniformly covered with Ga—a state of (1×1)), and the substrate surface was Ga-rich.

Then, the supply of P was shut off, and dimethylhydrazine ($4 \times 10^{-5}$ Torr) was supplied to the substrate surface for 15 minutes to make GaN epitaxially grow. After that, the RHEED pattern was observed. The RHEED pattern was the same as that of working examples 2 and 3.

WORKING EXAMPLE 6

The second semiconductor device was manufactured as described below using the crystal growth apparatus shown in FIG. 3.

First, the S1 single crystal substrate of crystal orientation (111) was subjected to ultrasonic cleaning with acetone for 15 minutes, and then dipped in hydrofluoric acid with a concentration of 100% for five minutes. Immediately after that, the substrate was introduced into the introduction chamber A1.

From another experiment, it was verified that a natural oxide film with a thickness of about 2 nm remained on the surface of the substrate treated under the above-mentioned conditions.

Then, after the introduction chamber A1 was evacuated to a super-high vacuum of $1 \times 10^{-8}$ Torr, the substrate was transferred to the preparation chamber A2 by using the transfer rod 5, and set to the substrate holder.

After the preparation chamber A2 was evacuated to a super-high vacuum of $1 \times 10^{-9}$ Torr by operating the ion pump 2, the substrate 4 was heated to 500° C. by the heater 6, held at that temperature for 30 minutes, and then cooled to a temperature of 100° C.

Then, the gate valve 1 was opened, and the substrate 4 was transferred to the growth chamber A3 by using the transfer rod 5 and set to the manipulator.

After the growth chamber A3 was evacuated to a super-high vacuum of $1 \times 10^{-9}$ Torr by operating the diffusion pump 3, the substrate 4 was heated to 650° C. at a temperature increasing rate of 50° C./min.

While the temperature of the substrate 4 was held at 650±0.5° C., dimethylhydrazine was supplied from the dimethylhydrazine supply means C2 to the substrate surface so that the pressure of dimethylhydrazine showed by the flux gage is $5 \times 10^{-5}$ Torr. After that, that temperature was maintained for 10 minutes to partially nitride the residual natural oxide film.

After the supply of dimethylhydrazine was stopped, the substrate 4 was heated at a temperature increasing rate of 25° C./min by the substrate heater 7. When the temperature of the substrate 4 reached 850° C., the shutter of the metallic Ga supply means B1 is opened to supply a metallic Ga flux ($6.0 \times 10^{-7}$ Torr) onto the surface of the substrate 4, by which one layer of monomolecular film of metallic Ga was formed on the surface of the substrate. Then, the shutter of the metallic Ga supply means B1 was closed, and ammonia was supplied from the ammonia supply means C1 to nitride the monomolecular film of metallic Ga.

While the temperature of the substrate 4 was held at 850±0.1° C., the trimethylgallium supply means B4 was opened to supply trimethylgallium in a flux gage vacuum of $5\times10^{-7}$ Torr, and the crystal growth was effected by the MOMBE method for two hours.

During this period, the RHEED pattern of the growing Ga crystal was observed by RHEED, and it was found that the crystal showed a streak-shaped pattern. Therefore, it could be verified that the GaN crystal was a single crystal, and the surface was smooth.

Also, the thickness of the crystal film after two hours was about 500 nm. The surface was observed under a Nomarski microscope, and it was found that the surface was a mirror surface without surface defects.

INDUSTRIAL APPLICABILITY

In the case of the semiconductor device in accordance with the present invention, a high-quality III-V compound semiconductor nitride layer having a great film thickness and high crystallizability, especially a GaN compound semiconductor layer, is formed by using any of a sapphire substrate, a S1 single crystal substrate, a GaAs single crystal substrate, and a GaP substrate.

This is an effect achieved by the fact that a GaN single crystal film with a thickness not greater than 3 nm is formed on the surface of substrate (in the case of the first semiconductor device), or the fact that a natural oxide film on the surface of a S1 single crystal substrate is partially nitrided to be converted into a SiON film (in the case of the second semiconductor device).

Therefore, the present invention allows the manufacture of semiconductor devices having a high-quality GaN crystal layer, and can manufacture blue light emitting devices and electron devices capable of operating at high a temperature and pressure, thereby achieving a great effect in the field of the information industry, satellite communications, and the like.

Moreover, since the GaN single crystal film serving as a buffer layer is very thin, being not thicker than 3 nm, the time required for forming the film is short, and the manufacturing cost of the whole device can be reduced significantly as compared with the case where the conventional amorphous buffer layer is formed.

What is claimed is:

1. A device made of a III-V nitride compound simiconductor comprising:
   a Si single crystal substrate;
   a SiON film formed on the surface of said Si single crystal subtrate; and
   at least ane layer of a III-V nitride compound semiconductor formed on said SiON film.

2. The device made of a III-V nitride compound semiconductor according to claim 1, which further comprises a GaN single crystal film which is interposed between said SiON film and said layer of the III-V compound semiconductor.

3. The device made of a III-V nitride compound semiconductor according to claim 1, wherein said layer of the III-V nitride compound semiconductor is made of GaN.

4. The device made of a III-V nitride compound semiconductor according to claim 1, wherein the III-V nitride compound is selected from the group consisting of BN, AlN, InN, GaN, AlGaN, InGaN and AlInGaN.

5. The device made of a III-V nitride compound semiconductor according to claim 2, wherein said layer of the III-V nitride compound semiconductor is made of GaN.

6. A method for producing a device made of III-V nitride compound semiconductor comprising:
   forming one or two layers of a metallic Ga monomolecular film on the surface of a substrate;
   forming a GaN single crystal film with a thickness not greater than 3 nm by making GaN single crystals grow epitaxially on said metallic Ga monomolecular film; and
   forming at least one layer of a III-V nitride compound semiconductor by making a III-V nitride compound semiconductor grow epitaxially on said GaN single crystal film.

7. A method for producing a device made of a III-V nitride compound semiconductor comprising:
   heat-treating a GaAs single crystal substrate in an atmosphere containing As or heat-treating a GaP single crystal substrate in an atmosphere containing P;
   forming a GaN single crystal film with a thickness not greater than 3 nm by making GaN single crystals grow epitaxially on a surface of the heat-treated substrate; end
   forming at least one layer of a III-V nitride compound semiconductor by making a III-V nitride compound semiconductor grow epitaxially on said GaN single crystal film.

8. A method for producing a device made of a III-V nitride compound semiconductor comprising:
   partially nitriding a natural oxide film formed on a surface of a S1 single crystal substrate to form a SiON film; and
   forming at least one layer of a III-V nitride compound semiconductor by making a III-V nitride compound semiconductor grow epitaxially on said SiON film.

9. The method for producing a device made of a III-V nitride compound semiconductor according to claim 8, which further comprises epitaxially growing GaN single crystals on said SiON film, and then the III-V nitride compound semiconductor is made to grow epitaxially.

10. The method for producing a device made of a III-V nitride compound semiconductor according to claim 9, wherein said III-V nitride compound semiconductor is GaN.

11. The method for producing a device made of a III-V nitride compound semiconductor according to claim 8,wherein said III-V nitride compound semiconductor is GaN.

* * * * *